(12) United States Patent
Yang

(10) Patent No.: US 6,458,604 B1
(45) Date of Patent: Oct. 1, 2002

(54) METHOD FOR FABRICATING CAPACITOR

(75) Inventor: Woo-Seok Yang, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/022,502

(22) Filed: Dec. 20, 2001

(30) Foreign Application Priority Data

Dec. 30, 2000 (KR) ........................................ 2000-86619

(51) Int. Cl.[7] ................................................ H01G 7/06
(52) U.S. Cl. ........................................ 438/3; 438/240
(58) Field of Search ........................... 438/3, 240, 238, 438/253–256, 381, 396–399

(56) References Cited

U.S. PATENT DOCUMENTS 5,609,927 A * 3/1997 Summerfelt et al. ........... 134/1

* cited by examiner

Primary Examiner—Jey Tsai
(74) Attorney, Agent, or Firm—Jacobson Holman, PLLC

(57) ABSTRACT

A method for fabricating a capacitor comprises the steps of performing a planarization process after forming a diffusion barrier on a semiconductor substrate including a plug and a silicide layer, depositing a adhesion layer on the entire structure and exposing the diffusion barrier by a selectively etching process, sequentially depositing a bottom electrode, a ferroelectric layer and a top electrode on the entire structure, forming a top electrode pattern performing a plasma etching process and a first recovery thermal treatment process and forming a ferroelectric layer and bottom electrode patterns by performing a plasma etching process and a second recovery thermal treatment process.

11 Claims, 10 Drawing Sheets

METHOD FOR FABRICATING CAPACITOR

FIELD OF THE INVENTION

The present invention relates to a method for fabricating a capacitor; and, more particularly, to a method for fabricating a ferroelectric capacitor.

DESCRIPTION OF THE PRIOR ART

As integration of a semiconductor device increases, a capacitor having a high charge capacity in a small space and a low leakage current to obtain good electric characteristics of the capacitor has been required. A ferroelectric layer, such as a SBT ($SrBi_2Ta_2O_9$) layer, a PZT layer or the like, has been used in the capacitor. Also, a Pt layer having good electrical characteristics is used as an electrode material.

When a semiconductor device having a plug, which is a conductive layer, such as a polysilicon layer, is fabricated by using the ferroelectric layer, thermal treatment processes for crystallization of a ferroelectric layer and for recovering remnant polarization are required. At this time, the thermal treatment processes cause thermal deterioration and oxidation of the plug so that contact resistance increases. Accordingly, reduction of the thermal treatment temperature is required below 650° C.

The recovery thermal treatments are performed for recovering a thermally deteriorated ferroelectric characteristic caused by plasma impact. Since it is an important issue to decrease the temperature of the recovery thermal treatments, the recovery thermal treatments are performed with two steps. A first step is performed after forming an electrode and a second step is performed after forming a contact hole for a metal wire.

In the case of the second step, an insulating layer for planarization, which is formed on the plug, prevents that the plug is thermally deteriorated, however, in case of the first step, the plug is thermally deteriorated and oxidized by oxygen diffusion through sidewalls of the capacitor. Conventionally, the first step is performed after a top electrode, a ferroelectric layer and a bottom electrode are etched.

When the first recovery thermal treatment is performed, since plasma impacts are caused by etching processes of the top electrode, the ferroelectric layer and the bottom electrode have to be removed, a high thermal treatment temperature is needed so that thermal deterioration and oxidation of the plug are caused and recovery of the ferroelectric characteristic is decreased.

SUMMARY OF THE INVENTION

It is, therefore, an object of the present invention to provide a method for fabricating a capacitor capable of improving the electrical characteristics thereof by preventing oxidation of a plug by reducing the temperature of a thermal treatment process.

In accordance with an aspect of the present invention, there is provided a method for fabricating a capacitor comprising the steps of: a) performing a planarization process after forming a diffusion barrier on a semiconductor substrate including a plug and a silicide layer; b) depositing an adhesion layer on the entire structure and exposing the diffusion barrier by a selectively etching process; c) sequentially depositing a bottom electrode, a ferroelectric layer and a top electrode on the entire structure; e) forming a top electrode pattern by performing a plasma etching process and a first recovery thermal treatment process; and f) forming a ferroelectric layer and bottom electrode patterns by performing a plasma etching process and a second recovery thermal treatment process.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, a method for manufacturing a semiconductor device preventing a plug from being thermally deteriorated and oxidized during a recovery thermal treatment process according to the present invention will be described in detail referring to the accompanying drawings.

FIGS. 1A to 1F are cross-sectional views showing a process for manufacturing a capacitor according to the present invention.

Figure 1A:
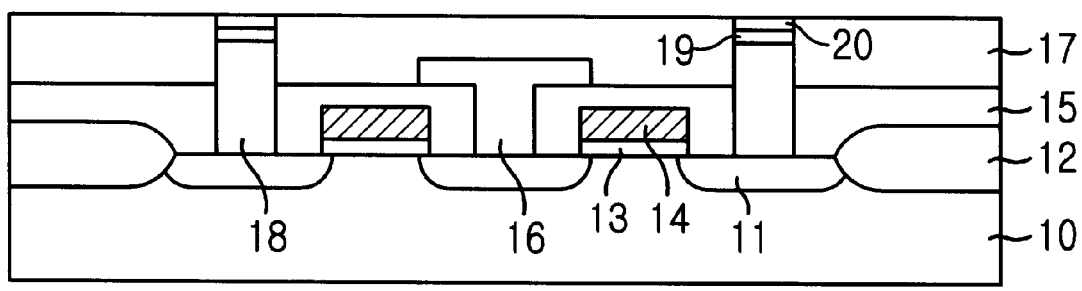
FIGS. 1A to 1F are cross-sectional views showing a process for fabricating a semiconductor memory device according to the preferred embodiment of the present invention.

Referring to FIG. 1A, a source/drain region 11, a field oxide layer 12, a gate insulating layer 13 and a gate electrode 14 are formed on a semiconductor substrate 10 such as a general DRAM. Subsequently, a first interlayer insulating layer 15 and a second interlayer insulating layer 17 are formed for separating the gate electrode 14 and a bit line 16 respectively.

A first contact hole is formed by selectively etching the first interlayer insulating layer 15 and the second interlayer insulating layer 17. A polysilicon plug 18 recessed in the contact hole, a silicide layer 19 and a diffusion barrier layer 20 are formed to a specific thickness in the contact hole. An Oxide layer formed by an HTO (high temperature oxidation) process or a BPSG (borophospho silicate glass) layer is used as the second interlayer insulating layer 17. The silicide layer 19 is formed by thermal reaction of a silicon layer and a titanium or cobalt layer. Also, the diffusing barrier layer 20 is formed with a TiN layer, a TiAlN layer or a TiSiN layer.

Figure 1B:
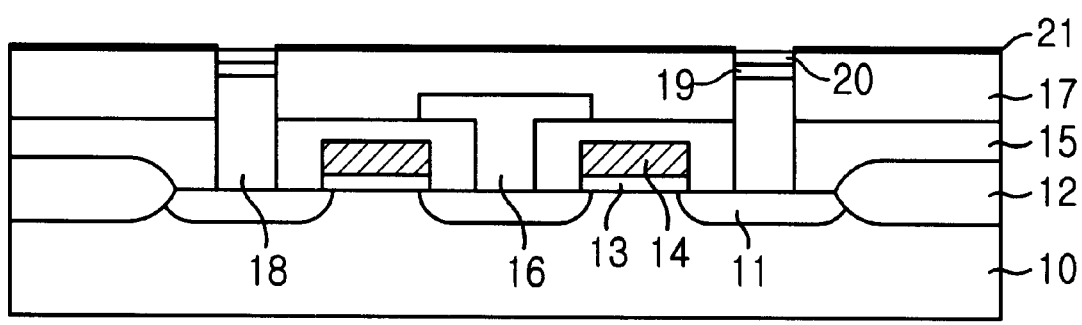

Referring to FIG. 1B, an adhesion layer 21 is deposited on the entire structure and then the diffusion barrier layer 20 is exposed by a masking and etching processes. At this time, a $SiO_2$ layer or a $Si_3N_4$ layer is used as the adhesion layer 21.

Figure 1C:
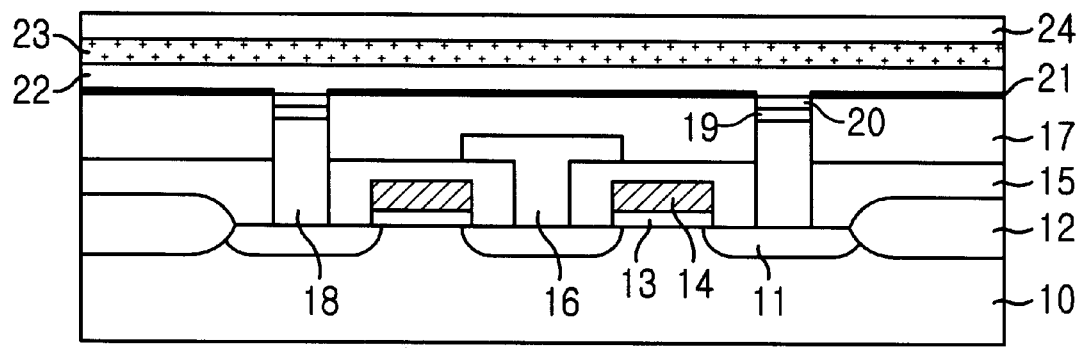

Referring to FIG. 1C, a ferroelectric capacitor is formed by sequentially depositing a bottom electrode 22, a ferroelectric layer 23 and a top electrode 24 on the entire structure. At this time, a thermal treatment process for crystallizing a ferroelectric layer 23 is performed before or after forming the top electrode 24. Herein, a Pt/$IrO_2$/Ir layer or an $IrO_2$/Ir layer is used as the bottom electrode 22.

Also, a PZT ($PbZr_x,Ti_{1-x}O_3$) (herein, x is 0.4 to 0.6), SBT ($Sr_xBi_yTa_2O_9$), SBTN ($Sr_xBi_y(Ta_iNb_j)_2O_9$) (herein, x is 0.7 to 1.0, y is 2.0 to 2.6, i is 0.6 to 0.9 and j is 0.1 to 0.4) or $Bi_{4-x}La_xTi_3O_{12}$ (herein, x is 0.5 to 0.9) layer is used as the ferroelectric layer. A compound layer of an $IrO_2$/Pt family or an $IrO_2$ layer is used as the top electrode 24.

Figure 1D:
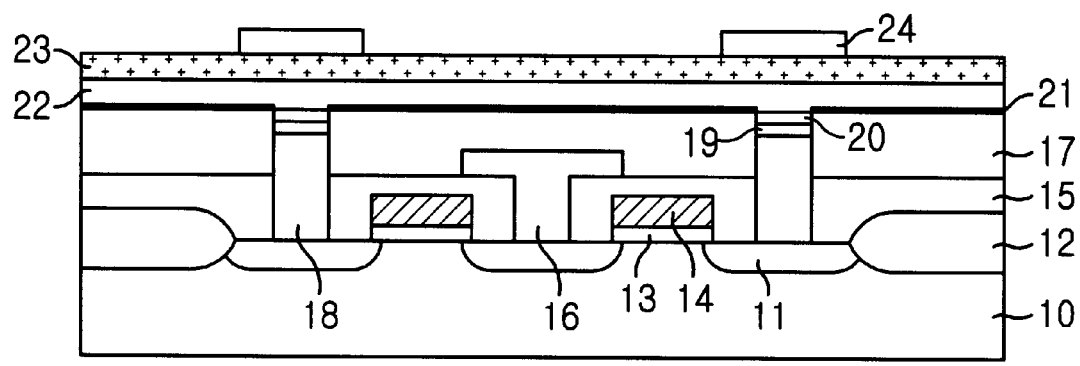

Referring to FIG. 1D, a top electrode pattern is formed by an etching process on the top electrode 24. The first recovery thermal treatment process is performed at a relatively low temperature of 450° C. to 650° C. so that the thermally deteriorated remnant polarization of the ferroelectric layer 23, which is caused by plasma impact when an etching process on the top electrode 24 is performed, is nearly recovered.

When the ferroelectric layer 23 is the PZT layer, the first recovery thermal treatment is performed in an ambient of an oxygen ($O_2$) gas, a nitrogen ($N_2$) gas or an argon (Ar) gas at a temperature of 450° C. to 550° C. for 5 minutes to 20 minutes. When the ferroelectric layer 23 is the BST, BLT or SBTN layer, the first recovery thermal treatment process is performed at a temperature of 550° C. to 650° C. for 10 minutes to 30 minutes.

Figure 1E:
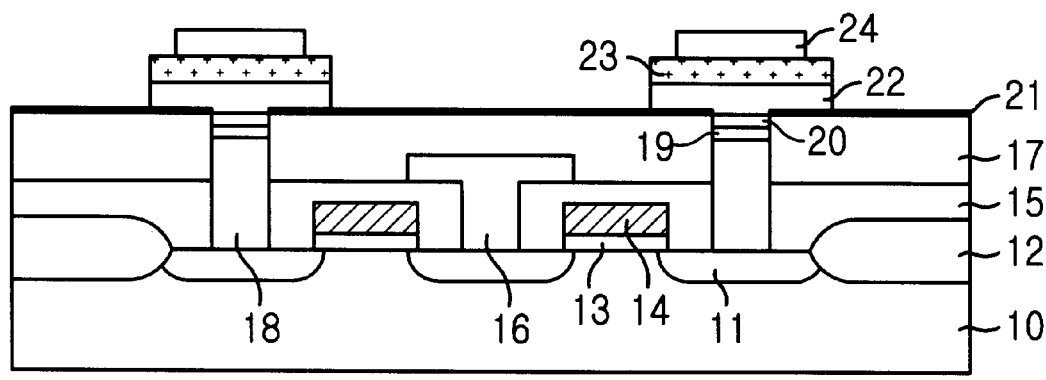

Referring to FIG. 1E, when patterns of the ferroelectric layer 23 and the bottom electrode 22 are formed through the etching process, the second recovery thermal treatment process is performed at a relatively low temperature of 450° C. to 600° C. so that the plasma impact in etching the ferroelectric layer 23 and the bottom electrode 22 is removed. Accordingly, the plasma impact of the capacitor is minimized through the two thermal treatment processes at a relatively low temperature rather than a conventional recovery thermal treatment process, which is performed over 650° C. Also, the thermally deteriorated characteristic of the capacitor can be decreased.

The second thermal treatment is performed in an ambient of a nitrogen gas or an argon gas and at a temperature of 450° C. to 550° C. for 5 minutes to 10 minutes when the PZT layer is used as the ferroelectric layer and, also, performed at a temperature of 500° C. to 600° C. for 10 minutes to 30 minutes when the BST, BLT or SBTN layer is used as the ferroelectric layer.

Figure 1F:
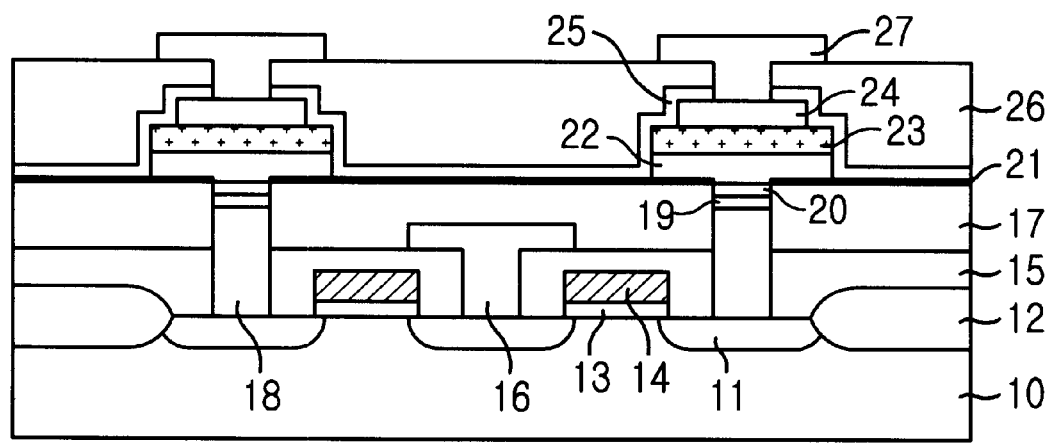

Referring to FIG. 1F, a hydrogen diffusion barrier layer 25, such as an $Al_2O_3$ layer or the like, and a silicon oxide layer or a flattened insulating layer 26, such as a SOG (spin on glass) layer, are sequentially formed and then a second contact hole is formed by etching the hydrogen diffusion barrier layer 25 and the flattened insulating layer 26. Subsequently, a third recovery thermal treatment process is performed for recovering the ferroelectric characteristic and a TiN reflection protecting layer, which is a (arc-TiN)/Al/TiN layer, is deposited. A metal wire layer 27 is formed by etching the TiN reflection protecting layer.

When the second contact hole is formed, in order to minimize the thermal deterioration of the ferroelectric characteristic from plasma impact, an upper portion of the flattened insulating layer 26 is etched by a wet etching process not using the plasma and then the rest of the lower portion is etched by a dry etching process using the plasma.

The third recovery thermal treatment is performed in an ambient of a nitrogen gas or an ammonia gas and at a temperature of 450° C. to 550° C. for 5 minutes to 20 minutes when the PZT layer is used as the ferroelectric layer and, also, performed at a temperature of 550° C. to 650° C. for 10 minutes to 30 minutes when the BST, BLT or SBTN layer is used as the ferroelectric layer.

Figure 3A:
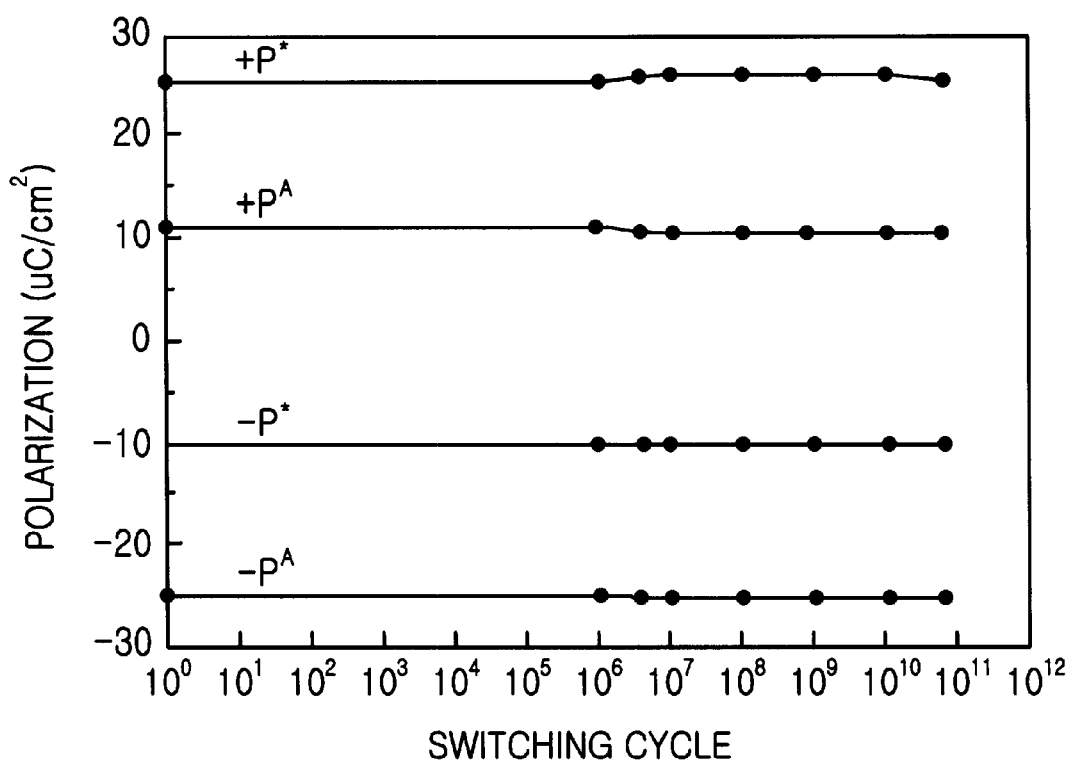
FIGS. 3A to 3D are graphs showing the temperature dependency of a recovery thermal treatment in an etching process of a capacitor.
Figure 3B:
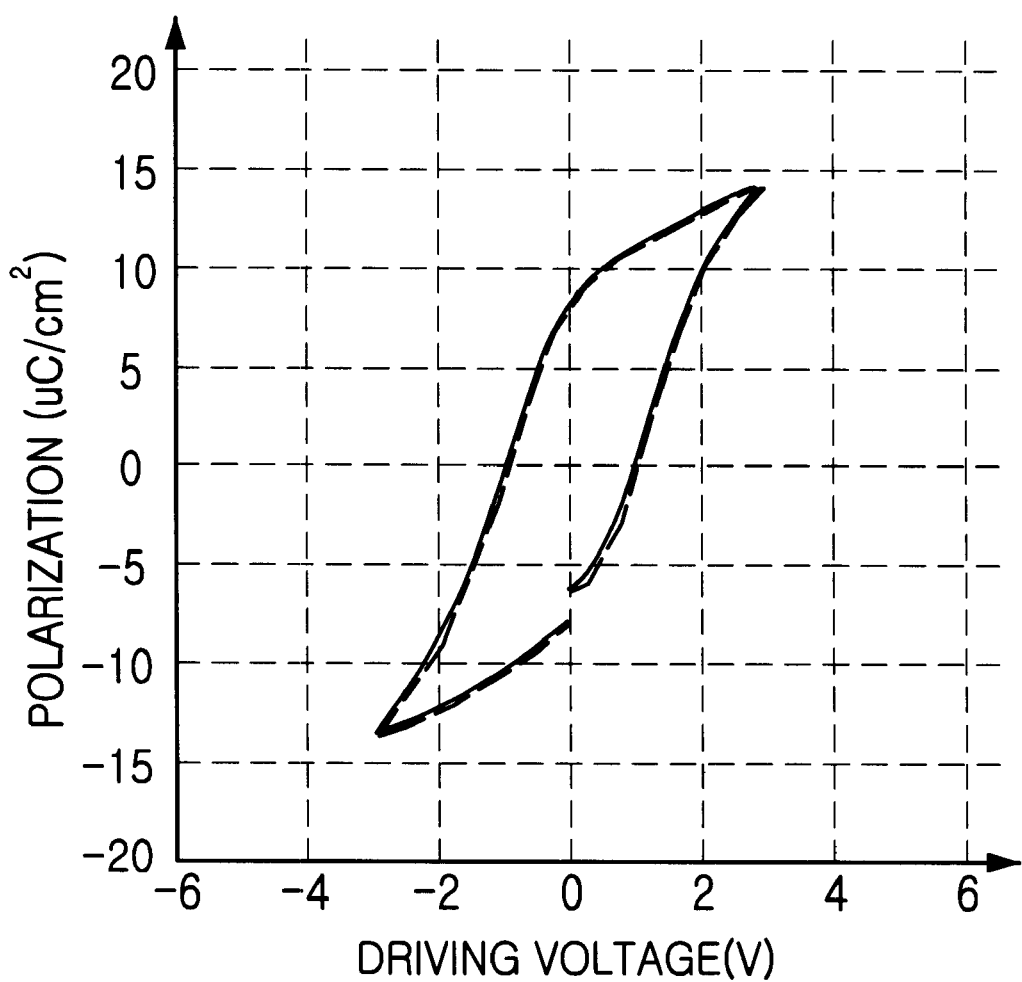
Figure 3B:
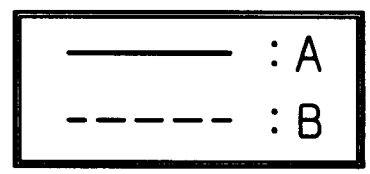

FIGS. 3A to 3B are graphs showing a thermally deteriorated ferroelectric characteristic when the recovery thermal treatment process of the capacitor is performed at a temperature of 600° C. after performing the dry etching process using a plasma for the top electrode and performing the wet etching process for the ferroelectric layer.

FIGS. 3A to 3D are graphs showing a thermally deteriorated ferroelectric characteristic when the recovery thermal treatment process of the capacitor is performed at a temperature of 600° C. after performing the dry etching process using a plasma for the top electrode and then performing the dry etching process using a plasma for the ferroelectric layer.

In FIGS. 3A to 3D, a vertical axis represents a polarization value. A horizontal axis represents a switching cycle in FIG. A and 3C and represents driving voltage in FIGS. 3B and 3D.

Figure 3C:
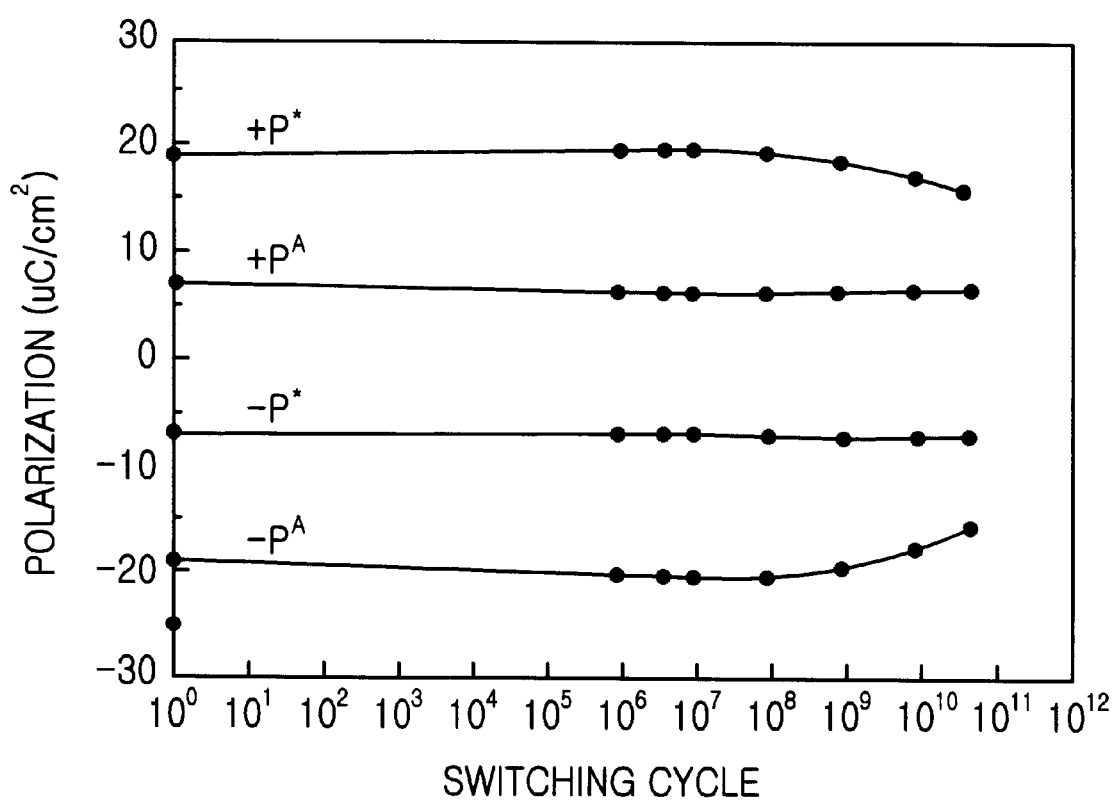
Figure 3D:
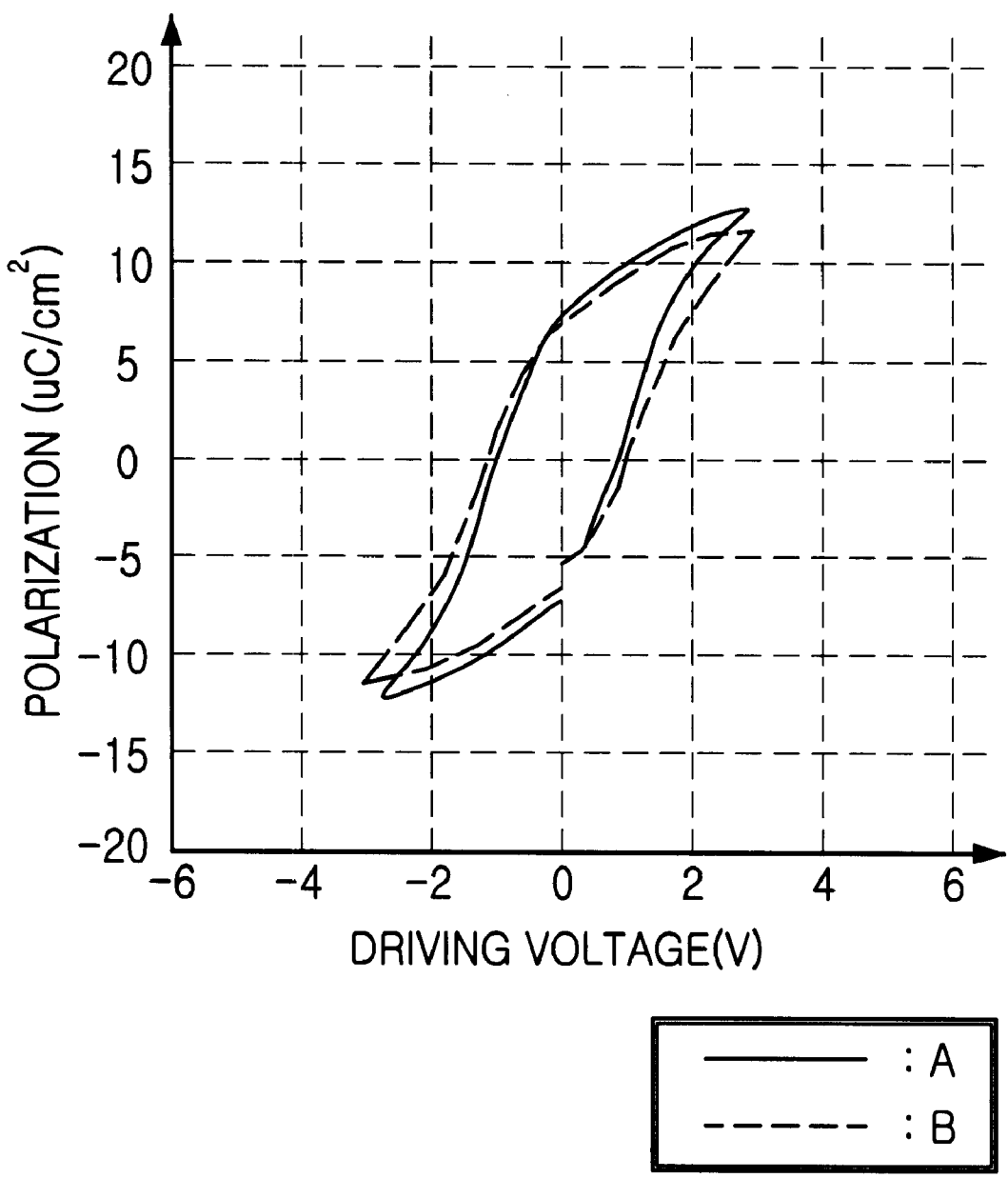

In FIGS. 3A and 3C, +P* and −P* represent saturated positive and negative polarization values respectively and +$P^A$ and −$P^A$ represent positive and negative remnant polarization values respectively. Also, ΔP represents the amount of the remnant polarization value.

Referring to FIGS. 3A to 3B, the amount of the remnant polarization value is recovered by a recovery thermal treatment at a temperature of 600° C. in switching cycles over $10^{11}$ in the case of performing a dry etching process using the plasma only for the top electrode. Namely, the ferroelectric characteristic is highly deteriorated after the recovery thermal treatment at a temperature of 600° C. In FIG. 3B, 'A' represents polarization values before a etching process and 'B' represents polarization values after the recovery thermal treatment.

FIGS. 2A to 2E are cross-sectional views showing processes for fabricating a capacitor according to another embodiment of the present invention. Like reference numerals in FIGS. 1A to 1F and FIGS. 2A to 2E refer to like elements.

Figure 2A:
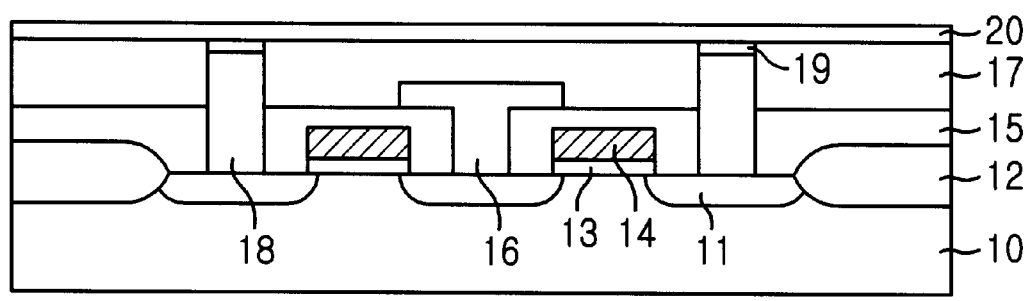
FIGS. 2A to 2E are cross-sectional views showing a process for fabricating a semiconductor memory device according to another embodiment of the present invention.

Referring to FIG. 2A, a source/drain junction 11, a field oxide layer 12, a gate oxide layer 13 and a gate electrode 14 are formed on the semiconductor substrate 10. Subsequently, a first interlayer insulating layer 15 and a second interlayer insulating layer 17 are formed to isolate the gate electrode 14 and a bitline 16.

A first contact hole (not denoted) is formed by selectively etching the first and second interlayer insulating layers 15 and 17 and a recess polysilicon plug 18 is formed in the contact hole. A silicide layer 19 is formed on the plug in the contact hole. A diffusion barrier layer 20 is formed over the entire structure. The second interlayer insulating layer 17 is formed with an oxide layer formed by a high temperature oxidation (HTO) process or a boro-phospho silicate glass (BPSG). The silicide layer is formed by the thermal reaction of a silicon layer and a titanium layer or a cobalt layer. A TiN layer, a TiAlN layer or a TiSiN layer is used as the diffusion barrier layer 20.

Figure 2B:
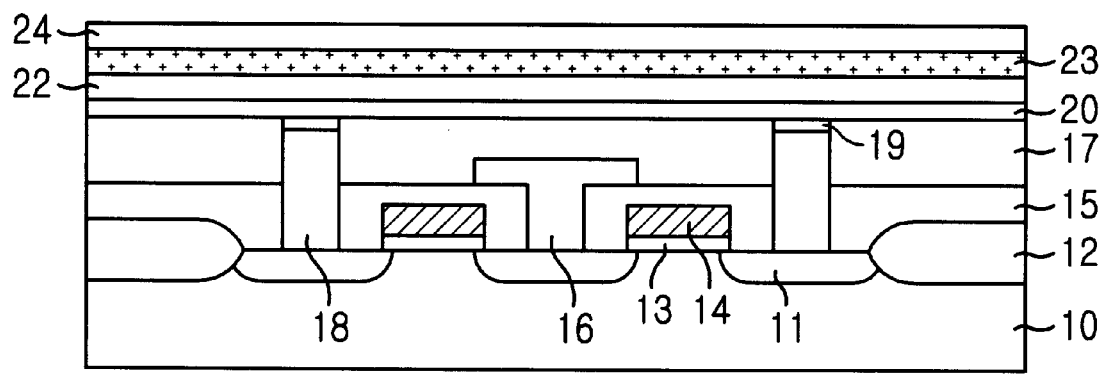

Referring to FIG. 2B, a bottom electrode 22, a ferroelectric layer 23 and a top electrode 24 are sequentially formed on the diffusion barrier layer 20. A thermal treatment process for crystallizing the ferroelectric layer 23 is carried out before or after forming the top electrode 24. A Pt/$IrO_2$/Ir layer or an $IrO_2$/Ir layer is used as the bottom electrode 22.

The ferroelectric layer 23 is formed by a PZT ($PbZr_xTi_{1-x}O_3$) (where, x is 0.4 to 0.6) layer, a SBT ($Sr_xBi_yTa_2O_9$) layer, SBTN ($Sr_xBi_y(Ta_iNb_j)_2O_9$) (where, x is to 0.7 to 1.0, y is 2.0 to 2.6, i is 0.6 to 0.9 and j is 0.1 to 0.4) layer or a $Bi_{4-x}La_xTi_3O_{12}$(where, x is 0.5 to 0.9) layer and the top electrode 24 is formed by an $IrO_2$/Pt layer or an $IrO_2$ layer.

Figure 2C:
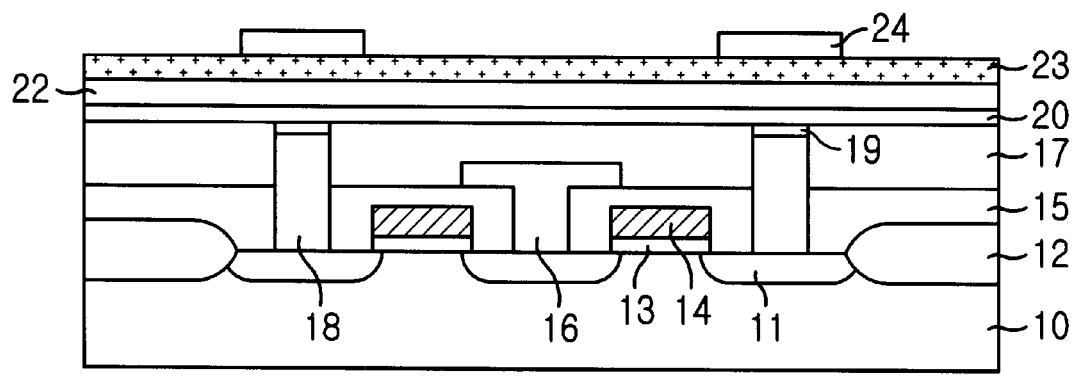

Referring to FIG. 2C, patterns are formed by etching the top electrode 24 and a first recovery thermal treatment process is carried out at a relatively low temperature of 450° C. to 650° C. so that remnant polarization values of the ferroelectric layer 23 deteriorated by the plasma impact in the etching process are recovered.

When the ferroelectric layer is a PZT layer, the first recovery thermal treatment process is carried out in an ambient of an $O_2$ gas, a $N_2$ gas or an Ar gas and at a temperature of 450° C. to 550° C. for 5 minutes to 20 minutes and when the BST layer, the BLT layer or the SBTN layer is used as the ferroelectric layer 23, the first recovery thermal treatment process is carried out in an $O_2$ gas, a $N_2$ gas or an Ar gas and at a temperature of 550° C. to 650° C. for 10 minutes to 30 minutes.

Figure 2D:
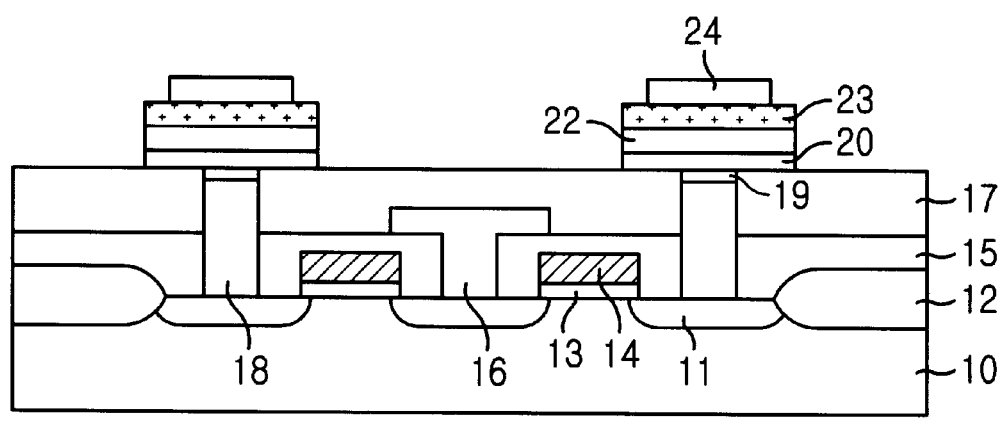
Figure 2E:
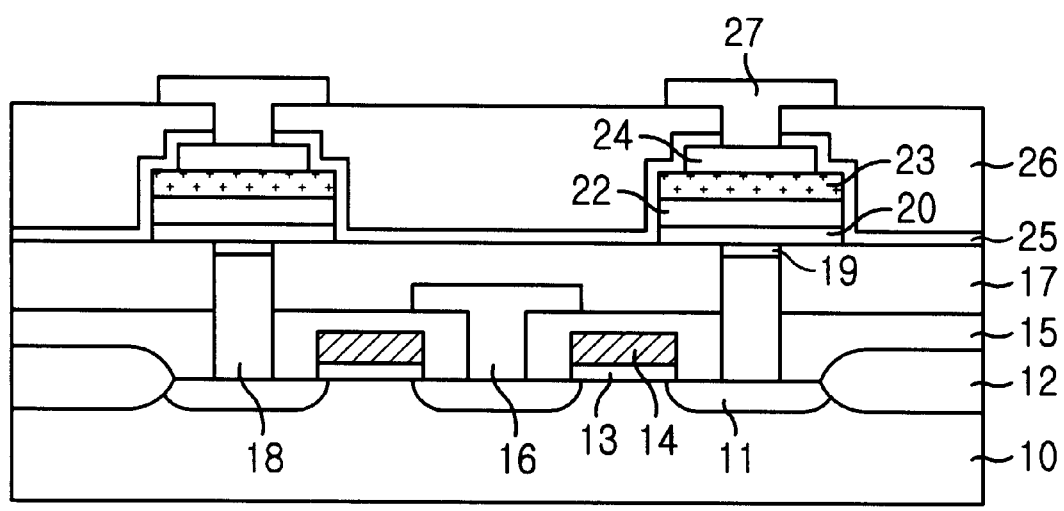

Referring to FIG. 2D, patterns are formed by etching the ferroelectric layer 23, the bottom electrode 22 and the diffusion barrier layer 20 and then a second recovery thermal treatment process is carried out at a relatively low temperature of 450° C. to 600° C. so that a plasma impact generated in the etching process of the ferroelectric layer 23 and the bottom electrode 22 is removed. As the recovery thermal treatment process is carried out two times at a relatively low temperature, deterioration of the ferroelectric layer generated in the thermal treatment process can be reduced compared with a thermal treatment carried out one time at a high temperature of over 650° C. Also, since the recovery thermal treatment process is carried out at a relatively low temperature, a thermal treatment impact can be minimized.

As mentioned the above, a method for fabricating a capacitor according to the present invention carries out the recovery thermal treatment processes in multiple steps at a relatively low temperature so that a ferroelectric characteristic deterioration is prevented and contact resistance is reduced.

While the present invention has been described with respect to the particular embodiments, it will be apparent to those skilled in the art that various changes and modifications may be made without departing from the spirit and scope of the invention as defined in the following claim.

What is claimed is:

1. A method for fabricating a capacitor comprising the steps of:
   a) performing a planarization process after forming a diffusion barrier on a semiconductor substrate including a plug and a silicide layer;
   b) depositing an adhesion layer on the entire structure and exposing the diffusion barrier performing a selective etching process;
   c) sequentially depositing a bottom electrode, a ferroelectric layer and a top electrode on the entire structure;
   e) forming a top electrode pattern performing a plasma etching process and a first recovery thermal treatment process; and
   f) forming a ferroelectric layer and bottom electrode patterns performing a plasma etching process and a second recovery thermal treatment process.

2. The method as recited in claim 1, wherein the ferroelectric layer is formed by a PZT ($PbZr_xTi_{1-x}O_3$) (herein, x is 0.4 to 0.6) layer and the first recovery thermal treatment process is carried out in an ambient of a gas selected from the group consisting of an oxygen gas, a nitrogen gas and an argon gas and at a temperature of 450° C. to 550° C. for 5 minutes to 20 minutes.

3. The method as recited in claim 1, wherein the ferroelectric layer is formed by a layer selected from the group consisting of a BST, a BLT and a SBTN layer and the first recovery thermal treatment process is carried out in an ambient of a gas selected from the group consisting of an oxygen gas, a nitrogen gas and an argon gas and at a temperature of 550° C. to 650° C. for 10 minutes to 30 minutes.

4. The method as recited in claim 1, wherein the ferroelectric layer is formed by a PZT ($PbZr_xTi_{1-x}O_3$) (herein, x is 0.4 to 0.6) layer and the second recovery thermal treatment process is carried out in an ambient of a gas selected from the group consisting of a nitrogen gas and an argon gas and at a temperature of 450° C. to 550° C. for 5 minutes to 20 minutes.

5. The method as recited in claim 1, wherein the ferroelectric layer is formed by a layer selected from the group consisting of a BST, a BLT and a SBTN layer and the second recovery thermal treatment process is carried out at an ambient of a nitrogen gas or an argon gas and at a temperature of 550° C. to 650° C. for 10 minutes to 30 minutes.

6. The method as recited in claim 1 further comprising the steps of:
   g) depositing a hydrogen diffusion barrier layer and a flattening insulating layer and performing an etching process to expose a portion of the top electrode;
   h) performing a third recovery thermal treatment process; and
   i) forming a metal wire layer on the exposed top electrode.

7. The method as recited in claim 6, wherein the etching process includes the steps of:
   g1) performing a wet-etching process to deposit the flattening insulating layer; and
   g2) performing a plasma etching process to deposit the hydrogen diffusion barrier layer.

8. The method as recited in claim 1, wherein the bottom electrode is formed by a layer selected from the group consisting of a Pt/$IrO_2$/Ir layer and an $IrO_2$/Ir layer.

9. The method as recited in claim 1, wherein the top electrode is formed by a layer selected from the group consisting of an $IrO_2$/Pt layer and an $IrO_2$ layer.

10. The method as recited in claim 7, wherein the third recovery thermal treatment process is carried out in an ambient of a gas selected from the group consisting of a nitrogen gas and an argon gas and at a temperature of 450° C. to 550° C. for 5 minutes to 20 minutes when the ferroelectric layer is a PZT ($PbZr_xTi_{1-x}O_3$) (where x is 0.4 to 0.6) layer.

11. The method as recited in claim 7, wherein the third recovery thermal treatment process is carried out in an ambient of a gas selected from the group consisting of a nitrogen gas and an argon gas and at a temperature of 550° C. to 650° C. for 10 minutes to 30 minutes when the ferroelectric layer is a layer selected from the group consisting of a BST, a BLT and a SBTN layer.

* * * * *